(12) United States Patent
Dobler et al.

(10) Patent No.: US 6,614,704 B2
(45) Date of Patent: Sep. 2, 2003

(54) CIRCUIT AND METHOD FOR REFRESHING MEMORY CELLS IN A DRAM

(75) Inventors: Manfred Dobler, München (DE); Markus Rohleder, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/991,791

(22) Filed: Nov. 19, 2001

(65) Prior Publication Data

US 2002/0080674 A1 Jun. 27, 2002

(30) Foreign Application Priority Data

Nov. 18, 2000 (DE) .......................................... 100 57 275

(51) Int. Cl.[7] .............................................. G11C 7/00
(52) U.S. Cl. ...................................... 365/222; 365/201
(58) Field of Search .................................. 365/222, 201

(56) References Cited

U.S. PATENT DOCUMENTS 5,321,661 A * 6/1994 Iwakiri et al. ............. 365/222

OTHER PUBLICATIONS

Betty Prince, "Semiconductor Memories", 1983, Wiley, 2nd edition, pp. 220–221.*

Taku Ohsawa et al.: "Optimizing the DRAM Refresh Count for Merged DRAM/Logic LSIs", International Symposium on Low Power Electronics and Design, Proceedings of the IEEE, ISBN 1–58113–059–7, 1998, pp. 82–87.

Search Report issued by the German Patent and Trademark Office on Jul. 2, 2001.

* cited by examiner

Primary Examiner—M. Tran
(74) Attorney, Agent, or Firm—Laurence A. Greenberg; Werner H. Stemer; Gregory L. Maybeck

(57) ABSTRACT

The memory cells of a DRAM are refreshed such that the temporal sequence of the control signals for triggering the information refresh operation for the individual memory cells is set in accordance with the respective maximum retention time for the information in the memory cell.

6 Claims, 1 Drawing Sheet

CIRCUIT AND METHOD FOR REFRESHING MEMORY CELLS IN A DRAM

BACKGROUND OF THE INVENTION

Field of the Invention

The invention relates to an apparatus for controlling an information refresh operation in memory cells in a memory module and to a corresponding method in which a periodic sequence of control signals for triggering the information refresh operation is applied to the memory cells.

In dynamic random access memories (DRAMs), it is necessary for the information stored in the memory cells to be periodically refreshed, since the memory cells can retain the information stored in them for only a limited time. The reason for this is that capacitors are used as memory cells for DRAMs. These capacitors discharge themselves after a specific time as a result of unavoidable quiescent currents, so that the stored charges of the capacitors have to be regularly renewed. The memory cells are therefore recharged at fixedly predetermined time intervals, so-called refresh cycles. The pulse for recharging, the so-called refresh pulse, can be generated internally within the module or else externally. In modern DRAMs, refresh cycles of at least 4096 refresh operations per 64 ms (refresh rate 6 k/64 ms) are customary.

The refresh cycle for the DRAM, i.e. the interval between the individual refresh pulses, must be chosen such that even the memory cell with the shortest retention time, which specifies how long the memory content can be retained in the associated cell, is refreshed again in good time. The conventional refresh method in the case of DRAMs therefore has the consequence that even memory cells with longer retention times are refreshed again prematurely. This leads to an unnecessarily high current consumption in the DRAM and shortens, in particular, the operating duration of accumulator- or battery-operated computers having such DRAMs. Since the normal writing and reading operations of the DRAM are interrupted during the refresh operation, e.g. by the presence of a so-called wait command at the processor which controls the DRAM, the availability of the DRAM is also reduced by the short refresh cycles required for the memory cells.

The article OHSAWA, T.; KAI, K.; MURAKAMI, K.: Optimizing the DRAM refresh count for merged DRAM/logic LSIs. IN: International Symposon on Low Power Electronics and Design. Proceedings of the IEEE.ISBN 1-58113-059-7, 1998, pp. 82–87, discloses a generic type of an apparatus for controlling an information refresh operation in memory cells in a memory module and a corresponding generic type of method in which the temporal sequence of the control signals for triggering the refresh operation of individual memory cell rows can be individually adapted to the average retention time of the memory cell row. In this case, it is furthermore possible for the respective refresh cycles to be configured as an integer multiple of a predetermined basic period.

SUMMARY OF THE INVENTION

It is accordingly an object of the invention to provide an apparatus for controlling an information refresh operation and a method for controlling an information refresh operation which overcomes the above-mentioned disadvantages of the prior art apparatus and methods of this general type. In particular, it is an object of the invention to provide an apparatus for controlling an information refresh operation and a method for controlling an information refresh operation that enable optimized individual setting of the refresh cycle to the respective retention time of a corresponding memory cell. It is also an object of the present invention, therefore, to develop dynamic random access memories in such a way that the current consumption is reduced and the access time is increased.

With the foregoing and other objects in view there is provided, in accordance with the invention, an apparatus for controlling an information refresh operation in memory cells of a memory module. The apparatus includes: a control device for applying a periodic sequence of control signals to memory cells of a memory module for triggering an information refresh operation in individual ones of the memory cells; and a test circuit for determining a maximum retention time of information in individual ones of the memory cells in the memory module. The test circuit is connected to the control device. The control device is designed to set a temporal sequence of the control signals for triggering the information refresh operation in the individual ones of the memory cells in a variable manner in accordance with the determined maximum retention time of the information in the individual one of the memory cells.

In accordance with an added feature of the invention, the control device is designed to combine the memory cells of the memory module into groups in accordance with the determined maximum retention time of information in the individual ones of the memory cells. The control device assigns, to each individual one of the groups, a respective predetermined time period for applying the control signals to the individual one of the groups. The predetermined time period is an integer multiple of a predetermined basic period.

With the foregoing and other objects in view there is provided, in accordance with the invention, a method for controlling an information refresh operation in memory cells in a memory module, that includes steps of: providing a memory module having memory cells; using an upstream test cycle to individually determine a maximum retention time of information in each of the memory cells; applying to the memory cells, a periodic sequence of control signals for triggering an information refresh operation; and setting a temporal sequence of the control signals for triggering the information refresh operation in individual ones of the memory cells in accordance with the determined maximum retention time of the information in the individual ones of the memory cells.

In accordance with an added mode of the invention, the method includes steps of: combining the memory cells in the memory module into groups in accordance with the determined maximum retention time of the information in each of the memory cells; assigning, to each individual one of the groups, a respective predetermined time period for applying the control signals to the individual one of the groups; and providing the predetermined time period as an integer multiple of a predetermined basic period.

In accordance with an additional mode of the invention, the method includes steps of: during the test cycle, for each one of the memory cells: a) reading in a test datum; b) refreshing the test datum with a predetermined frequency; c) reading out the test datum; and d) comparing the test datum that was read in with the test datum that was read out to detect whether or not there is an error. If no error was detected in step d), then steps a) to d) are repeated with a progressively decreased refresh frequency until an error is detected in step d). If the error was detected in step d), then steps a) to d) are repeated with a progressively increased refresh frequency until an error is not detected in step d).

In the case of the invention's control of an information refresh operation in memory cells in a memory module, the temporal sequence of the control signals for triggering the information refresh operation for the individual memory cells is coordinated with the respective maximum retention time of the information in the memory cell.

This design of the refresh driving enables the refresh cycle to be individually adapted to the retention time of the respective cell to be refreshed, that is to say the maximum retention time of the information in the memory cell. Therefore, it is also no longer necessary to define the refresh cycle for the memory module in accordance with the shortest retention time that occurs in the module. The result is that the memory cells with longer retention times are also no longer refreshed unnecessarily prematurely. The reduction of the refresh operations in the memory cells in the memory module, which is possible as a result of the utilization of individual refresh cycles, thus provides for a significant saving in the current consumption. This is particularly advantageous in accumulator- or battery-operated computers, in which the reduced power consumption of the memory modules in the refresh operations enables the maximum operating duration of the computer to be significantly prolonged.

According to the invention, the maximum retention time of the information in the individual memory cells in the memory module is determined by a test sequence, in order then to combine the memory cells in groups preferably in accordance with the defined retention periods for memory contents. In this manner, one can define the individual refresh periods for the refresh operation of a memory cell group. This upstream test sequence makes it possible, in a simple manner, to individually coordinate the refresh times in memory cells and thus to optimally adapt the power consumption in the respective memory module.

In accordance with a preferred embodiment, the memory cells in the memory module are combined in groups in accordance with the maximum retention time of the memory content. The individual groups are each assigned a predetermined time period between the successive control signals, which is preferably an integer multiple of a predetermined basic period. This configuration of the refresh driving makes it possible to achieve particularly simple assignments between the memory cells and the refresh cycles individually coordinated therewith. Simple generation of these individual refresh periods are made possible in particular by virtue of the design of the individual refresh time periods as an integer multiple of a predetermined basic period.

Other features which are considered as characteristic for the invention are set forth in the appended claims.

Although the invention is illustrated and described herein as embodied in a circuit and method for refreshing memory cells in a dram, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
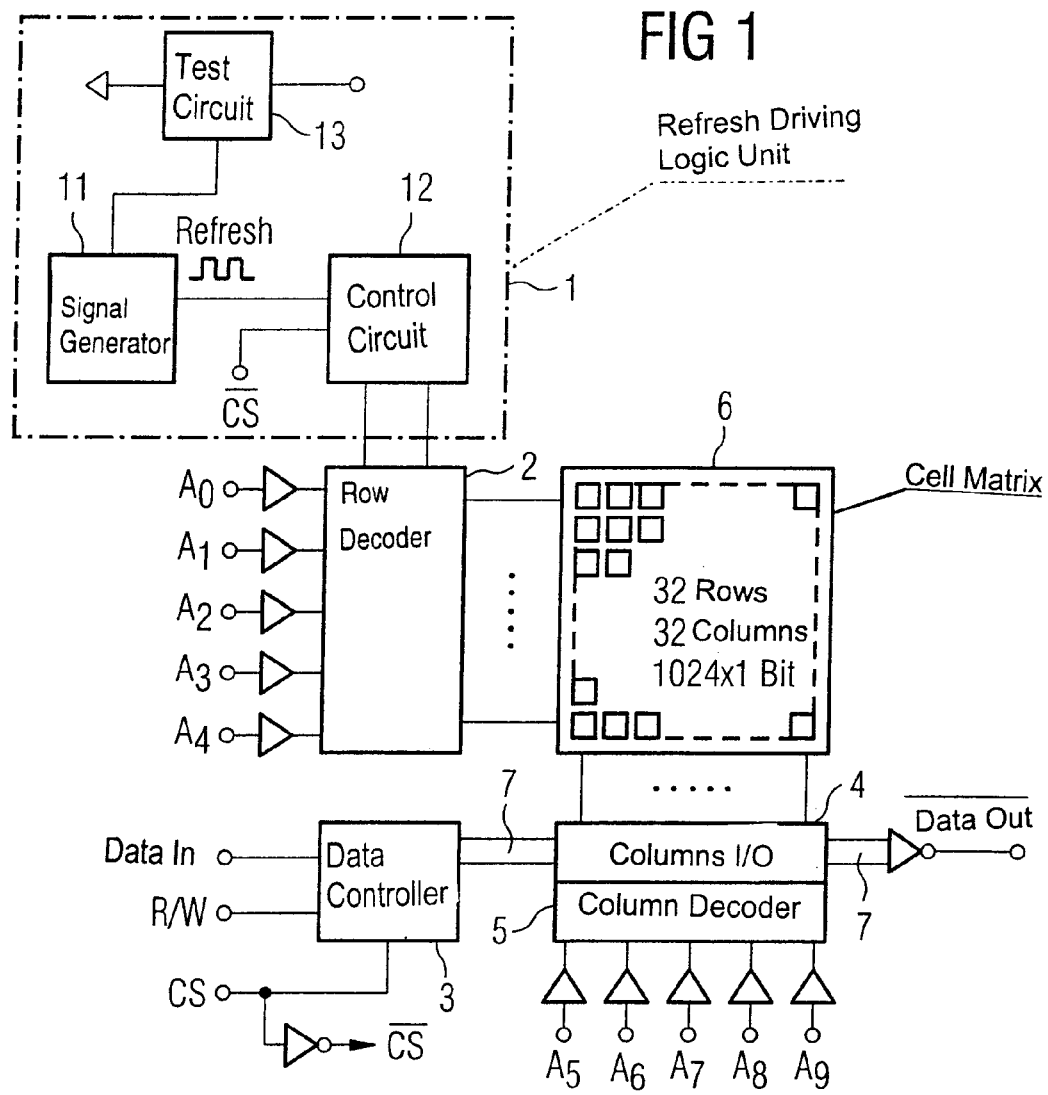
FIG. 1 shows a block illustration of a dynamic random access memory and an integrated refresh logic unit.

Referring now to the figures of the drawing in detail and first, particularly, to FIG. 1 thereof, there is shown a block diagram of a DRAM. Reference symbol 1 specifies a refresh driving logic unit integrated in the DRAM. Reference symbol 2 specifies a row decoder for decoding address lines $A_0$–$A_4$, reference symbol 3 specifies a data controller. Reference symbol 4 specifies a column input/output circuit, reference symbol 5 specifies a column coder for decoding the signals fed via address lines $A_5$–$A_9$, and reference symbol 6 specifies a cell matrix. Reference symbol 7 designates a read/write bus, which, in connection with the data present at the data controller 3 performs writing to or reading from the cell matrix 6 via the column read-in/output circuit 4 in a manner dependent on a read/write signal R/W and a memory select signal CS. In the embodiment illustrated, this cell matrix 6 includes 32 rows and 32 columns, which corresponds to a dynamic memory having a capacity of 1 Kbit (1024×1 bits).

The refresh of the memory contents of the cell matrix 6 is performed by the internal refresh driving logic unit 1. In this case, the driving takes place row by row, as is customary. To that end, a signal generator 11 in the refresh driving logic unit 1 applies a refresh clock signal to a refresh control circuit 12. The control circuit 12 has a further input for an inverted chip select signal $\overline{CS}$. In this case, the control circuit 12 is designed in such a way that a refresh pulse is output only when the cell matrix 6 is not being addressed, i.e. when an inverted chip select signal $\overline{CS}$ is present. What is achieved by this refresh sequence is that the refresh operation is synchronized with the access to the cell matrix 6 in such a way that the refresh operation is performed only when the cell matrix 6 is not being accessed. This prevents the refresh operation from giving rise to a time loss in the event of access to the cell matrix 6.

If an overlap between an external access to the cell matrix 6 and a refresh cycle cannot be entirely precluded, a priority decoder (not shown) can additionally be used, which then acknowledges an external access to the cell matrix with a wait command, so that first the current refresh cycle is concluded and afterward the external access is then performed.

Besides this technique—also known as the "hidden refresh" method—of synchronization between the refresh operation and the access to the memory cells of the cell matrix, it is also possible, however, to employ any other known method for temporally dividing the refresh operation and the access to the cell matrix. In the case of so-called burst refresh, normal operation is always interrupted for the refresh operation and the refresh cycle is then carried out for all of the memory cells of the cell matrix. What is disturbing in this procedure, however, is that the memory module is fundamentally blocked during the refresh operation. By contrast, in the case of so-called cycle stealing, contiguous blocking of the cell matrix is avoided by the refresh operation for the cell matrix being subdivided into a plurality of refresh steps in which only individual areas are refreshed. External access to the cell matrix is then again blocked during the individual refresh operations.

In addition to generating the refresh clock signal internally within the module by the signal generator 11, as an alternative, it can also be generated outside the module, e.g. by a processor.

In a cell matrix 6 of the kind shown in FIG. 1, a refresh rate of 4 k/64 ms is generally customary. This high cycle rate is necessary in order to prevent the information which is stored in the memory cells of the cell matrix and which is present in the form of capacitor charges from being lost on account of the unavoidable quiescent currents. In this case, the refresh rate of the cell matrix 6 must be set in such a way that, for all of the memory cells of the cell matrix, the capacitors in the memory cells are refreshed in good time, so that no memory contents are lost. Therefore, the required refresh cycle is conventionally determined by the shortest so-called retention time occurring in the cell matrix, the retention time specifying how long an individual memory cell can retain the memory information written to it. The consequence of this is that the memory cells of the cell matrix 6 with a longer retention time are generally already refreshed again prematurely and, as a result, an unnecessarily high current loading is brought about.

Figure 2:
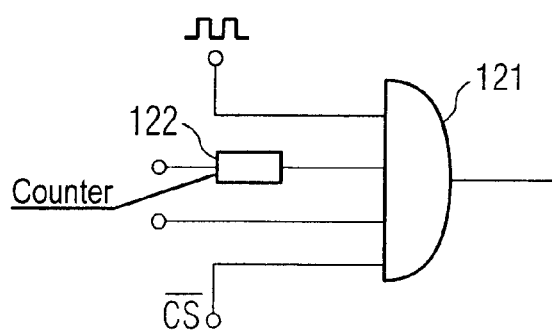
FIG. 2 shows a block diagram of an embodiment of a refresh logic unit.

In order to adapt the refresh cycles to the respective retention time of the memory cells in the cell matrix 6, the refresh driving logic unit 1 is designed in such a way that the temporal sequence of the control signals for triggering the information refresh operation is, in each case, individually coordinated with the individual memory cells of the cell matrix 6. The refresh frequency is set in accordance with the maximum retention time of the memory information in the respective memory cell. FIG. 2 shows a possible configuration of the refresh control circuit 12, in which individual refresh frequencies are utilized for the individual memory cells in the cell matrix 6.

In the embodiment shown in FIG. 2, the memory cells of the cell matrix are divided by way of example into two groups. In which case, the memory cells of one group are intended to be refreshed twice as often as those of the other group. These different refresh cycles can be achieved in a simple manner by means of an AND gate 121 configured in the control circuit 12. The AND gate 121 logically combines the refresh signal of the signal generator 11 with an address signal A(X), which distinguishes between the two module halves, a control signal of a 2-bit counter 122, which is driven by the highest cell address A(H) of the cell matrix 6, and an inverted chip signal $\overline{CS}$.

What is achieved by this configuration, in a simple manner, is that, during the refresh operation, a distinction is made between the two module halves with their different refresh frequencies. A refresh is effected only whenever the additional selection signal A(X) for the respective module half is present at the AND gate 121. In order to refresh one group of the cell matrix twice as often as the other group, first two refresh cycles are carried out for the cell group with the high refresh frequency and only then is a refresh cycle carried out for the cell group with the low refresh frequency. In the embodiment shown, in which the cell matrix 6 is divided in half, the current consumption can be reduced by a quarter compared with conventional refresh methods.

As an alternative to the embodiment shown in FIG. 2, however, it is possible to subdivide the cell matrix 6 into more than two groups with an arbitrary number of frequencies. In this case, it is preferable for the cells to be combined in such a way that the refresh cycles of the different cell groups are integer multiples of a basic period predetermined by the signal generator 11. However, it is also possible for autonomous, mutually independent refresh cycles to be predetermined for the individual cell matrix groups or for each individual memory cell, by individually adapting the refresh frequency that is predetermined by the signal generator 11 in the refresh control circuit 12 in accordance with a predetermined value for each memory cell group or memory cell.

In this case, the refresh cycle times for the individual memory cells in the cell matrix 6 can be determined in an upstream test method. For this purpose, as shown in FIG. 1, a test circuit 13 is provided in the refresh driving logic unit 1. The test circuit 13 is connected to the signal generator 11 and to the refresh control circuit 12 and is furthermore connected to the data bus 7 in order to read data into and out of the cell matrix. With the test circuit 13, it is possible, in a targeted manner, for test data to be read into the individual cells of the cell matrix 6, and after a predetermined time, to be read out again. At the same time, the test circuit 13 can be used to predetermine the refresh frequency of the signal generator 11 for the memory cell into which the test data were read. The signal generator 11 is, for example, of a voltage-controlled design.

The retention times of the memory cells of the cell matrix 6 are determined by the test circuit 13 by reading the test data into a predetermined memory cell of the cell matrix 6 during which a fixed refresh frequency has been set for the memory cell at the signal generator 11. After the test data have been read from the memory cell, it is then determined whether the test data written in corresponds to the test data read out. If this is the case, the refresh frequency is decreased by a predetermined frequency step and a renewed test cycle is then performed. This method is repeated iteratively until an error is detected during the comparison between the test data read in and the test data read out. As the refresh frequency for the tested memory cell, the test circuit 13 then returns the value of the preceding test step for which test data read in and test data read out still corresponded.

Conversely, if an error is detected in the first test step during the comparison between test data read in and test data read out, the refresh frequency is increased in predetermined frequency steps until the test data written in correspond to the test data read out. The resulting refresh frequency is then the required minimum refresh frequency for the corresponding memory cell of the cell matrix 6 which is retained by the test circuit 13.

Then, by means of an evaluation unit in the test circuit 13, the minimum refresh cycles ascertained in the test circuit 13 for the individual cells of the cell matrix 6 can, if appropriate, be ordered into groups with an assigned refresh frequency and these cell groups with their addresses and the associated refresh frequency can then be communicated to the refresh control circuit 12.

Consequently, individual refresh frequencies for the individual memory cells of the memory module can be defined in a simple manner using the test circuit 13 illustrated.

We claim:

1. An apparatus for controlling an information refresh operation in memory cells of a memory module, comprising:
   a control device for applying a periodic sequence of control signals to memory cells of a memory module for triggering an information refresh operation in individual ones of the memory cells; and
   a test circuit for determining a maximum retention time of information in individual ones of the memory cells in the memory module, said test circuit connected to said control device;
   said control device constructed to set a temporal sequence of the control signals for triggering the information refresh operation in the individual ones of the memory cells in a variable manner in accordance with the determined maximum retention time of the information in the individual one of the memory cells.

2. An apparatus for controlling an information refresh operation in memory cells of a memory module, comprising:
- a control device for applying a periodic sequence of control signals to memory cells of a memory module for triggering an information refresh operation in individual ones of the memory cells; and
- a test circuit for determining a maximum retention time of information in individual ones of the memory cells in the memory module, said test circuit connected to said control device;
- said control device constructed to set a temporal sequence of the control signals for triggering the information refresh operation in the individual ones of the memory cells in a variable manner in accordance with the determined maximum retention time of the information in the individual one of the memory cells;
- said control device constructed to combine the memory cells of the memory module into groups in accordance with the determined maximum retention time of information in the individual ones of the memory cells;
- said control device assigning, to each individual one of the groups, a respective predetermined time period for applying the control signals to the individual one of the groups, the predetermined time period being an integer multiple of a predetermined basic period.

3. A method for controlling an information refresh operation in memory cells in a memory module, which comprises:
- providing a memory module having memory cells;
- using an upstream test cycle to individually determine a maximum retention time of information in each of the memory cells;
- applying to the memory cells, a periodic sequence of control signals for triggering an information refresh operation; and
- setting a temporal sequence of the control signals for triggering the information refresh operation in individual ones of the memory cells in accordance with the determined
- maximum retention time of the information in the individual ones of the memory cells.

4. The method according to claim 3, which comprises:
- combining the memory cells in the memory module into groups in accordance with the determined maximum retention time of the information in each of the memory cells;
- assigning, to each individual one of the groups, a respective predetermined time period for applying the control signals to the individual one of the groups; and
- providing the predetermined time period as an integer multiple of a predetermined basic period.

5. The method according to claim 4, which comprises, during the test cycle, for each one of the memory cells:
- a) reading in a test datum;
- b) refreshing the test datum with a predetermined frequency;
- c) reading out the test datum;
- d) comparing the test datum that was read in with the test datum that was read out to detect whether or not there is an error;
- e1) if no error was detected in step d), repeating steps a) to d) with a progressively decreased refresh frequency until the error is detected in step d); and
- e2) if the error was detected in step d), repeating steps a) to d) with a progressively increased refresh frequency until the error is not detected in step d).

6. The method according to claim 3, which comprises, during the test cycle, for each one of the memory cells:
- e) reading in a test datum;
- f) refreshing the test datum with a predetermined frequency;
- g) reading out the test datum;
- h) comparing the test datum that was read in with the test datum that was read out to detect whether or not there is an error;
- e1) if no error was detected in step d), repeating steps a) to d) with a progressively decreased refresh frequency until the error is detected in step d); and
- e2) if the error was detected in step d), repeating steps a) to d) with a progressively increased refresh frequency until the error is not detected in step d).

* * * * *